(12) United States Patent
Yamamoto et al.

(10) Patent No.: US 10,233,530 B2
(45) Date of Patent: Mar. 19, 2019

(54) HARD FILM AND METHOD FOR FORMING SAME, AND DIE FOR USE IN HOT FORMING OF STEEL SHEET

(71) Applicant: KOBE STEEL, LTD., Kobe-shi (JP)

(72) Inventors: Kenji Yamamoto, Kobe (JP); Tomoyasu Takazawa, Toyama (JP); Katsutomo Miura, Seto (JP)

(73) Assignee: Kabushiki Kaisha Kobe Seiko Sho, Kobe-shi (JP)

( * ) Notice: Subject to any disclaimer, the term of this patent is extended or adjusted under 35 U.S.C. 154(b) by 139 days.

(21) Appl. No.: 15/120,285

(22) PCT Filed: Feb. 16, 2015

(86) PCT No.: PCT/JP2015/054173
§ 371 (c)(1),
(2) Date: Aug. 19, 2016

(87) PCT Pub. No.: WO2015/133256
PCT Pub. Date: Sep. 11, 2015

(65) Prior Publication Data
US 2017/0058392 A1 Mar. 2, 2017

(30) Foreign Application Priority Data

Mar. 3, 2014 (JP) .................. 2014-040137
Aug. 27, 2014 (JP) .................. 2014-173285

(51) Int. Cl.
C23C 14/06 (2006.01)
C23C 28/00 (2006.01)
C23C 14/32 (2006.01)

(52) U.S. Cl.
CPC ........ *C23C 14/0688* (2013.01); *C23C 14/325* (2013.01); *C23C 28/321* (2013.01);
(Continued)

(58) Field of Classification Search
USPC ............ 204/192.1, 192.15, 192.16; 428/336, 428/697, 698, 699; 427/249.1, 249.6,
(Continued)

(56) References Cited

U.S. PATENT DOCUMENTS 4,120,930 A * 10/1978 Lemelson ................ B22C 9/00
249/114.1
5,618,590 A 4/1997 Naruse et al.
(Continued)

FOREIGN PATENT DOCUMENTS

JP 5-78821 A 3/1993
JP 10-81949 A 3/1998
(Continued)

OTHER PUBLICATIONS

Extended European Search Report dated Sep. 7, 2017 in Patent Application No. 15758222.2.
(Continued)

*Primary Examiner* — Archene A Turner
(74) *Attorney, Agent, or Firm* — Oblon, McClelland, Maier & Neustadt, L.L.P.

(57) ABSTRACT

Disclosed is a hard film based on tungsten carbide excellent in wear resistance, wherein the composition of the film is defined by $W_{1-x-y}C_xM_y$, where $0.01 \leq y \leq 0.2$, $0.50 \leq x/(1-x-y) \leq 4.0$, and M is one or more selected from Co, Ni, Fe and Cu.

10 Claims, 4 Drawing Sheets

(52) U.S. Cl.
CPC ............ *C23C 28/34* (2013.01); *C23C 28/341* (2013.01); *C23C 28/3455* (2013.01); *C23C 28/36* (2013.01)

(58) Field of Classification Search
USPC ................ 427/249.7, 249.8, 249.17, 249.18; 264/338; 249/114.1, 116
See application file for complete search history.

(56) References Cited

U.S. PATENT DOCUMENTS

| | | | | |
|---|---|---|---|---|
| 6,472,029 | B1 * | 10/2002 | Skszek | ................... B23K 26/03 |
| | | | | 427/133 |
| 6,613,266 | B2 * | 9/2003 | McDonald | ................ B22C 9/04 |
| | | | | 249/116 |
| 8,062,715 | B2 * | 11/2011 | Skszek | ................... B29C 33/38 |
| | | | | 219/121.64 |
| 2002/0175476 | A1 | 11/2002 | Chinou et al. | |
| 2005/0133962 | A1 * | 6/2005 | Mumme | ............. B29C 33/3828 |
| | | | | 264/338 |
| 2008/0171183 | A1 | 7/2008 | Yamamoto | |
| 2009/0142509 | A1 | 6/2009 | Yamamoto | |
| 2011/0079069 | A1 | 4/2011 | Yamamoto | |
| 2013/0256130 | A1 | 10/2013 | Yamamoto | |

FOREIGN PATENT DOCUMENTS

| | | |
|---|---|---|
| JP | 2001-62623 A | 3/2001 |
| JP | 2003-14122 A | 1/2003 |
| JP | 2003-113941 A | 4/2003 |
| JP | 2008-150676 A | 7/2008 |
| JP | 2008-174782 A | 7/2008 |
| JP | 2009-155721 A | 7/2009 |
| JP | 5193153 B2 | 5/2013 |

OTHER PUBLICATIONS

H.Y. Lee, et al. "Synthesis of WC-Ni films using an arc ion plating system with attached solenoid coil," Surface & Coatings Technology, vol. 193, No. 1-3, XP027609295, 2005, pp. 303-308.
Li Yu, et al. "WC-x%Co films prepared by arc ion plating," International Journal of Refractory Metals & Hard Materials, XP055401732, 1998, pp. 95-98.
English translation of the International Preliminary Report on Patentability and Written Opinion dated Sep. 15, 2016 in PCT/JP2015/054173.
International Search Report dated May 19, 2015 in PCT/JP215/054173 Filed Feb. 16, 2015.

* cited by examiner

HARD FILM AND METHOD FOR FORMING SAME, AND DIE FOR USE IN HOT FORMING OF STEEL SHEET

TECHNICAL FIELD

The present invention relates to a hard film, with which a surface of jigs and tools for working steels or nonferrous materials of a forming die, a punch and the like is coated, and a method for forming the same, and a die for use in hot forming of a steel sheet.

BACKGROUND ART

It has hitherto been required for a cutting tool for high speed cutting or a cutting tool for cutting a high hardness material such as a hardened steel, each including a cemented carbide, a cermet or a high speed tool steel as a substrate, to have excellent wear resistance and sliding properties, so that a surface thereof is coated with a hard film such as TiN, TiCN or TiAlN (see, for example, Patent Document 1). A hard film made of TiCrAlSiN and the like is applied to a die for cold working for use in forming of a steel material typified by a high tension steel material and the like (see, for example, Patent Document 2).

PRIOR ART DOCUMENT

Patent Document

Patent Document 1: JP 2008-174782 A
Patent Document 2: JP 5193153 B2

DISCLOSURE OF THE INVENTION

Problems to be Solved by the Invention

However, in particular, when a steel material is subjected to hot working, iron oxide (scale) is formed on a surface of the steel material in atmospheric air, leading to severe wear in a die and the like, thus requiring a hard film having longer life than that of the hard films disclosed in Patent Documents 1 and 2.

In light of aforementioned problems, the present invention has been made, and it is an object thereof to provide a hard film which is formed on a surface of a substrate of jigs and tools and is excellent in wear resistance during hot working and the like, and a method for forming the same, and a die for use in hot forming of a steel sheet.

Means for Solving the Problems

To solve the foregoing problems, a hard film according to the present invention is based on tungsten carbide and is excellent in wear resistance, and the composition of the film is defined by $W_{1-x-y}C_xM_y$, where $0.01 \leq y \leq 0.2$, $0.50 \leq x/(1-x-y) \leq 4.0$, and M is one or more selected from Co, Ni, Fe and Cu.

In this way, a predetermined metal element is added to tungsten carbide and also an atomic ratio of carbon to tungsten is defined, whereby a hard film having excellent wear resistance to oxide of metal such as iron at particularly high temperature is obtained.

The hard film according to the present invention is preferably formed on an intermediate layer having a thickness of 1 μm or more consisting of a nitride, a carbonitride or a carbide of one or more elements selected from the group consisting of Group 4, Group 5, Group 6, Al and Si formed on a surface of a substrate.

Alternatively, in the hard film according to the present invention, a metal layer is preferably formed as a ground, and the metal layer has a thickness of 50 nm or more consisting of one or more elements selected from the group consisting of Group 4, Group 5, Group 6, Al and Si. It is particularly preferable that the intermediate layer consists of CrN, and the metal layer formed on the intermediate layer consists of Cr. The hard film according to the present invention is preferably formed on a multilayered film laminated on the intermediate layer or the metal layer, and the multilayered film is formed by alternately laminating a film consisting of one or more selected from the group consisting of W, C, Co, Ni, Fe and Cu, and a film consisting of one or more elements selected from the group consisting of Group 4, Group 5, Group 6, Al and Si.

In this way, a predetermined metal film or a film of a nitride or a carbide thereof is formed on a ground, whereby, a hard film formed with satisfactory adhesion is obtained.

In a die for use in hot forming of a steel sheet according to the present invention, the hard film is formed on a surface of the die.

In this way, a hard film with predetermined composition is formed on a surface, whereby, a die having excellent wear resistance is obtained, thus enabling prolonged life even when applied to hot working of a high strength steel material such as a high tension steel material.

A method for forming a hard film according to the present invention comprises forming the hard film by a cathode-type arc ion plating method using a target consisting of W, C and the metal element M in the composition.

In this way, application of the cathode arc ion plating method enables formation of a hard film having a desired thickness at a high film formation rate with satisfactory productivity. Use of a target including carbon and metal having a comparatively low melting point enables stable arc discharge even when the target is made of a material based on tungsten carbide.

Effects of the Invention

The film according to the present invention is formed on a surface of jigs and tools, leading to excellent wear resistance during working and the like. According to the method for forming a hard film according to the present invention, it is possible to stably form a hard film with satisfactory productivity in a stable manner. The die for use in hot forming of a steel sheet according to the present invention enables an increase in the number of usable times because of long life due to excellent wear resistance of the hard film on the surface.

MODE FOR CARRYING OUT THE INVENTION

Figure 1:
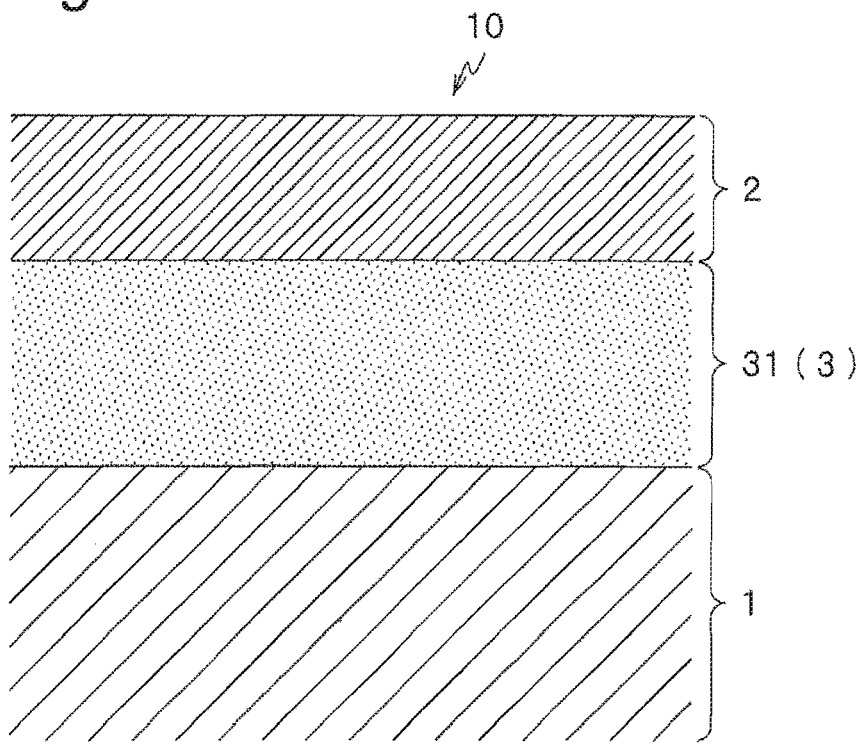
FIG. 1 is an enlarged cross-sectional view in the vicinity of a surface of a die for use in hot forming of a steel sheet according to the present invention.

Embodiments of the present invention will be described in detail below.

[Hard Film]

The hard film according to the present invention is applicable to the tools in general that require wear resistance by coating a surface of a substrate made of cemented carbide and the like. The hard film according to the present invention particularly exert the effect in a die for use in hot forming of a hard steel sheet and the like, which is used for hot working of steel materials, especially a high tension steel material that is hardly worked. In hot working of the steel material, iron oxide (scale) is formed on a surface of a workpiece (steel material) in air atmosphere at high temperature, leading to severe wear of the die. In such working, in order to impart wear resistance, the hard film is based on tungsten carbide (WC) and is defined by the following composition:

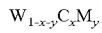

where $0.01 \leq y \leq 0.2$, $0.50 \leq x/(1-x-y) \leq 4.0$, and M is one or more selected from Co, Ni, Fe, and Cu.

(Ratio of C to W: 0.50 or More and 4.0 or Less)

As represented by the chemical formula WC, tungsten carbide is carbide in which W and C are bonded to each other at a ratio of 1:1. Therefore, as an atomic weight ratio of C to W, $x/(1-x-y)$, dissociates from 1, the proportion of a crystal of WC in a hard film decreases, and wear resistance of the hard film is degraded due to lack of the proportion. When the amount of C is more than that of W in the hard film ($x/(1-x-y)>1$), C (free C) precipitated without bonding to W has the effect of decreasing a wear coefficient of the hard film, and the effect is high when $x/(1-x-y)$ is 1.7 or less. However, when $x/(1-x-y)$ exceeds 2.3 thus leading to an increase in C, wear resistance is degraded. When $x/(1-x-y)$ exceeds 2.8, wear resistance is significantly degraded, and $x/(1-x-y)$ of exceeding 4.0 leads to lack of wear resistance. Therefore, in the hard film, $x/(1-x-y)$ is set at 4.0 or less and is preferably 2.8 or less, more preferably 2.3 or less, still more preferably 1.7 or less, and most preferably 1.2 or less. In contrast, in the hard film, when the amount of W is more than that of C ($x/(1-x-y)<1$), if $x/(1-x-y)$ is less than 0.50, lack of a crystal of WC leads to lack of wear resistance. Therefore, in the hard film, $x/(1-x-y)$ is set at 0.50 or more and is preferably 0.7 or more, and more preferably 0.8 or more.

(One or More Selected from Co, Ni, Fe and Cu: Atomic Ratio of 0.01 or More and 0.2 or Less)

As the metal element M to be added to the hard film according to the present invention, at least one is selected from Co, Ni, Fe and Cu. The addition of these elements to WC enables an increase in toughness, then improving wear resistance. Co is particularly preferable because of its high effect of increasing toughness. To obtain the above effect, the content rate of the metal element M in the hard film (y of the composition $W_{1-x-y}C_xM_y$) is set at atomic ratio of 0.01 (1 atomic %) or more, and preferably 0.02 or more. Meanwhile, when excessive metal element M is added, hardness of the hard film decreases, thus degrading wear resistance. Therefore, the content rate of the metal element M is set at atomic ratio of 0.2 (20 atomic %) or less, and is preferably 0.1 or less, and more preferably 0.05 or less. It is estimated that no peak is observed by X-ray diffraction even when Co is added to the hard film, so that Co is solid-solved in WC.

[Die for Use in Hot Forming of Steel Sheet]

The die for use in hot forming of a steel sheet according to the present invention is a die in which a substrate formed is coated with the above hard film. Furthermore, as shown in FIGS. 1 to 4, in a die 10 for use in hot forming of a steel sheet according to the present invention, any one of adhesion layers 3, 3A, 3B, and 3C composed of a single layer or two or more layers mentioned below is preferably formed, as a ground of a hard film 2, on a substrate 1. Namely, the die 10 for use in hot forming of a steel sheet includes a laminated film in which the adhesion layer 3 (3A, 3B, 3C) and the hard film 2 are continuously formed as mentioned below on the substrate 1.

(Substrate)

For example, the substrate 1 is made of a metal material such as a cemented carbide, an iron-base alloy including metal carbide, a cermet, a high speed tool steel, or a die steel (SKD), which is generally applied to a die for use in hot forming of a steel sheet, and is formed into a desired shape such as a die.

(Hard Film)

The hard film 2 is the above-mentioned hard film according to the present invention, and high wear resistance is imparted to a die for use in hot forming of a steel sheet by forming the hard film on a surface. There is no particular limitation on the thickness of the hard film 2, and the thickness is preferably in a range of 1 to 10 μm. The hard film 2 is preferably thick so as to improve wear resistance, however, too large thickness may cause peeling due to residual stress and the like of the hard film 2.

(Adhesion Layer)

Since the hard film 2 according to the present invention has high stability, namely, low reactivity, it may be difficult to obtain sufficient adhesion to an iron-base substrate, for example, such as a die steel, depending on the material of the substrate 1. Therefore, the die 10 for use in hot forming of a steel sheet preferably includes a film made of a material having high affinity to both the hard film 2 and the substrate 1, as the adhesion layer 3 (3A, 3B, 3C), between the substrate 1 and the hard film 2. Examples of such material include one or more elements (metal or alloy) selected from the group consisting of Group 4 (Ti, Zr, Hf), Group 5 (V, Nb, Ta), Group 6 (Cr, Mo, W), Al and Si, alternatively a nitride, a carbonitride or a carbide of the one or more elements mentioned above.

The intermediate layer 31 is made of a nitride, a carbonitride or a carbide of one or more elements selected from the group consisting of Group 4, Group 5, Group 6, Al and Si, and is formed on a ground of the hard film 2 as an adhesion layer 3 (namely, the adhesion layer 3 is used as a ground and the hard film 2 is formed on the adhesion layer 3) (see FIG. 1). To obtain sufficient adhesion, the thickness of the intermediate layer 31 is set at 1 μm or more and is preferably 5 μm or more, and more preferably 10 μm or more. Even when the thickness of intermediate layer 31 exceeds 15 μm, adhesion does not further increase, so that the thickness is preferably 15 μm or less from the viewpoint of productivity. The material of the intermediate layer 31 include CrN, TiN, (Ti,Al)N, (Al,Cr)N, (Al,Ti,Cr)N, TiC, TiCN and the like and, when the substrate 1 is an iron-base substrate, CrN is particularly preferable.

Figure 2:
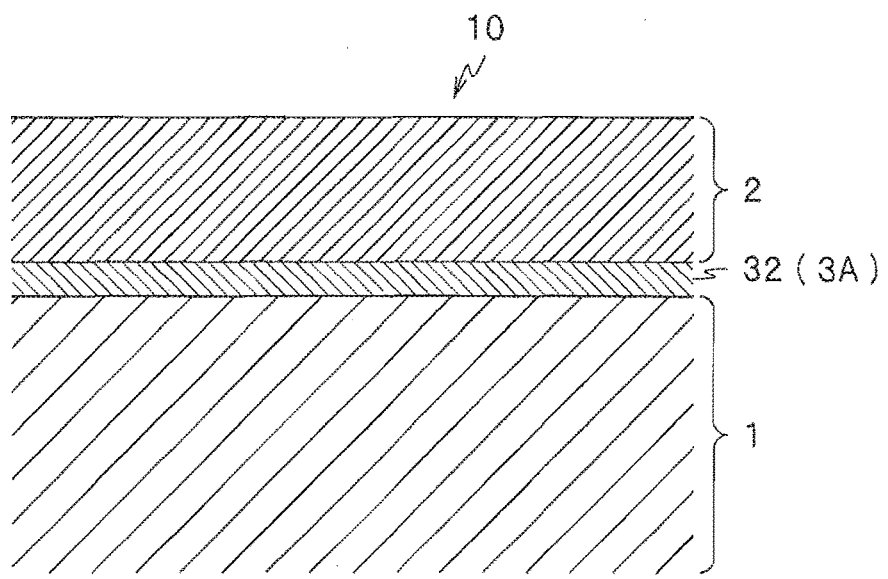
FIG. 2 is an enlarged cross-sectional view in the vicinity of a surface of a die for use in hot forming of a steel sheet according to the present invention.

The metal layer 32 is made of one or more elements selected from the group consisting of Group 4, Group 5, Group 6, Al and Si, and is formed on the hard film 2 as an adhesion layer 3A (see FIG. 2). To obtain sufficient adhesion, the thickness of the metal layer 32 is set at 50 nm or more. Meanwhile, when the metal layer 32 is excessively thick, an external force causes plastic deformation of the layer, so that the thickness is preferably 5 μm or less. When the substrate 1 is an iron-base substrate, it is particularly preferable that the metal layer 32 is formed of Cr.

Figure 3:
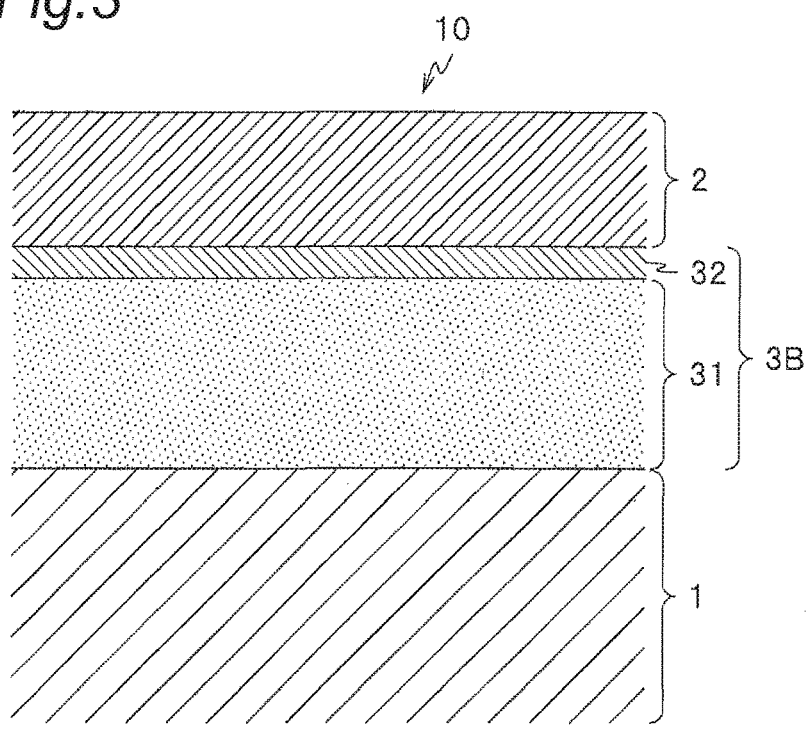
FIG. 3 is an enlarged cross-sectional view in the vicinity of a surface of a die for use in hot forming of a steel sheet according to the present invention.

Two layers of the intermediate layer 31 and the metal layer 32 may be provided on the ground of the hard film 2 as an adhesion layer 3B formed by laminating these layers. With such a structure, adhesion is more improved. In this case, as shown in FIG. 3, the intermediate layer 31, the metal layer 32, and the hard film 2 are laminated in this order from the side of the substrate 1. There is no particular limitation on the combination of each material of the intermediate layer 31 and the metal layer 32. For example, when the material of the intermediate layer 31 is TiN, Ti included in TiN is preferably applied to the material of the metal layer 32 since adhesion between the intermediate layer 31 and the metal layer 32 increases. As will be described in a method for forming a hard film mentioned below, it is also preferable in view of productivity since a Ti target can be used in common for the formation of the respective layers 31 and 32. When the substrate 1 is an iron-base substrate, it is particularly preferable that the intermediate layer 31 formed of CrN enabling high adhesion to the iron-base substrate and the metal layer 32 formed of Cr are combined and laminated.

Figure 4:
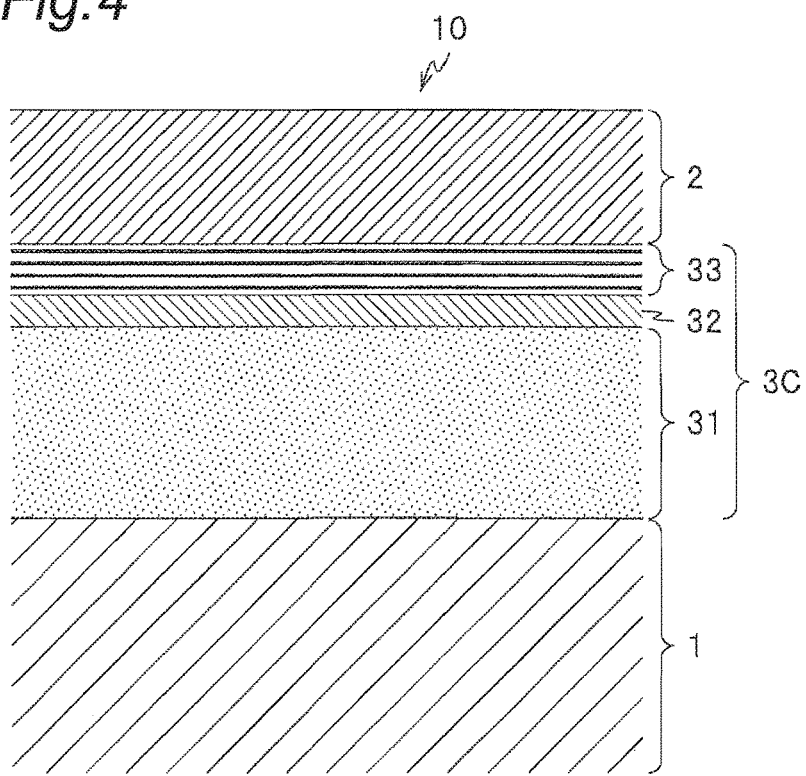
FIG. 4 is an enlarged cross-sectional view in the vicinity of a surface of a die for use in hot forming of a steel sheet according to the present invention.

It is also possible to further include, on the intermediate layer 31 or the metal layer 32, a multilayered film 33 (see FIG. 4), which is formed by alternately laminating a film made of one or more selected from W, C, Co, Ni, Fe and Cu (referred to as a WC-based film, a film made of W and C, and one or more selected from Co, Ni, Fe and Cu) and a film made of one or more elements selected from the group consisting of Group 4, Group 5, Group 6, Al and Si (referred to as a metal carbide film), as an adhesion layer, followed by formation of a hard film 2 thereon. With such a structure, adhesion of the hard film 2 to the substrate 1 is further improved. Further, as shown in FIG. 4, it is preferable to form an adhesion layer 3C in which the intermediate layer 31, the metal layer 32, and the multilayered film 33 are laminated in this order. Either the WC-based film or the metal carbide film may be formed on a lowermost layer and an uppermost layer in the multilayered film 33, respectively. To obtain sufficient adhesion, each thickness of the WC-based film and the metal carbide film as a single layer in the multilayered film 33 is preferably in a range of 5 to 50 nm, and the whole thickness of the multilayered film is preferably 0.1 μm or more. Meanwhile, when the thickness of the multilayered film 33 exceeds 2 μm, adhesion is more degraded as the thickness increases, so that the thickness is preferably 2 μm or less, and more preferably 1 μm or less.

There is no particular limitation on the combination of each material of the multilayered film 33 and the intermediate layer 31 or the metal layer 32. For example, the material of the intermediate layer 31 is preferably TiN and the material of the metal layer 32 is preferably Ti in view of productivity since TiC is applied to the metal carbide film, whereby, a Ti target can be used in common for the formation of a metal carbide film of the intermediate layer 31, the metal layer 32, and the multilayered film 33, as described in a hard film forming method mentioned below. In particular, when the substrate 1 is an iron-base substrate, the intermediate layer 31 is preferably formed of CrN and the metal layer 32 is preferably formed of Cr, furthermore, the metal carbide film of the multilayered film 33 is preferably formed of CrC. With such a structure, high adhesion to the iron-base substrate is obtained and, as mentioned above, a Cr target can be used in common for the formation of a metal carbide film of the layers 31 and 32 and the multilayered film 33. Therefore, it is preferable in view of productivity.

The composition of the WC-based film of the multilayered film 33 is preferably in a range of the composition of the hard film 2 $W_{1-x-y}C_xM_y$ (where $0.01 \leq y \leq 0.2$, $0.50 \leq x/(1-x-y) \leq 4.0$, and M is one or more selected from Co, Ni, Fe and Cu). The composition ratio may not be the same as that of the hard film 2. For example, when the hard film 2 is made of WC—Co (metal element M is Co), the WC-based film of the multilayered film 33 may be WC—Ni and, as described in a method for forming a hard film mentioned below, it is preferable that WC—Co is also applied to the WC-based film of the multilayered film 33 so that the target can be used in common.

[Method for Forming Hard Film]

The hard film according to the present invention can be formed by a known gas phase film formation method, for example, a sputtering method which is a kind of physical vapor deposition (PVD). When the sputtering method is applied, it is possible to form a hard film with the composition $W_{1-x-y}C_xM_y$ by discharging a target (vapor source) made of an alloy of W and a metal element M, such as a W—Co alloy in an atmosphere of a mixture of a carrier gas such as Ar and a hydrocarbon such as $CH_4$. However, the sputtering method is inferior in productivity when the film is formed in the thickness of some extent, like a hard film of a tool such as a die, because of its low film formation rate. Therefore, a cathode-type arc ion plating method is applied to the method for forming a hard film according to the present invention.

The cathode-type arc ion plating (AIP) method (hereinafter sometimes simply referred to as an AIP method) is a kind of PVD, just like the sputtering method, and achieves a high film formation rate by a method of melting and vaporizing a target at a large current, as compared with the sputtering method. Since W has a high melting point, when applied to a target of an AIP method, there are problems such as that film formation is not performed at an original film formation rate of an AIP method and it is difficult to perform arc discharge, because of low vaporization rate, so that W is not suited for use as a target material.

Therefore, in the method for forming a hard film according to the present invention, a target made of W, C and M (M is one or more selected from Co, Ni, Fe and Cu) is used. For example, a target made of a Co-containing WC-based alloy (WC—Co alloy) enables film formation at high rate as a result of discharge with ease even in the case of an arc system. It is also possible to use a WC-based alloy target containing, in addition to Co, Ni, Fe and Cu. When WC has a large grain size, uniform arc discharge hardly occurs, so that it is preferable to use a cemented carbide target in which WC has an average grain size of 10 μm or less. Such material includes, for example, WC—C material JIS type V.

The composition of the hard film may be adjusted by optionally adding a hydrocarbon such as $CH_4$ to a carrier gas such as Ar according to the composition of the WC-based alloy target. When $CH_4$ and the like are not added, an atomic ratio of C of the formed film tends to decrease as compare with the WC-based alloy target. Meanwhile, in the AIP method, a composition ratio of W and M of the WC-based alloy target usually is approximately a composition ratio of the formed film, so that a target corresponding to a composition ratio of W and M of a hard film is used.

Figure 5:
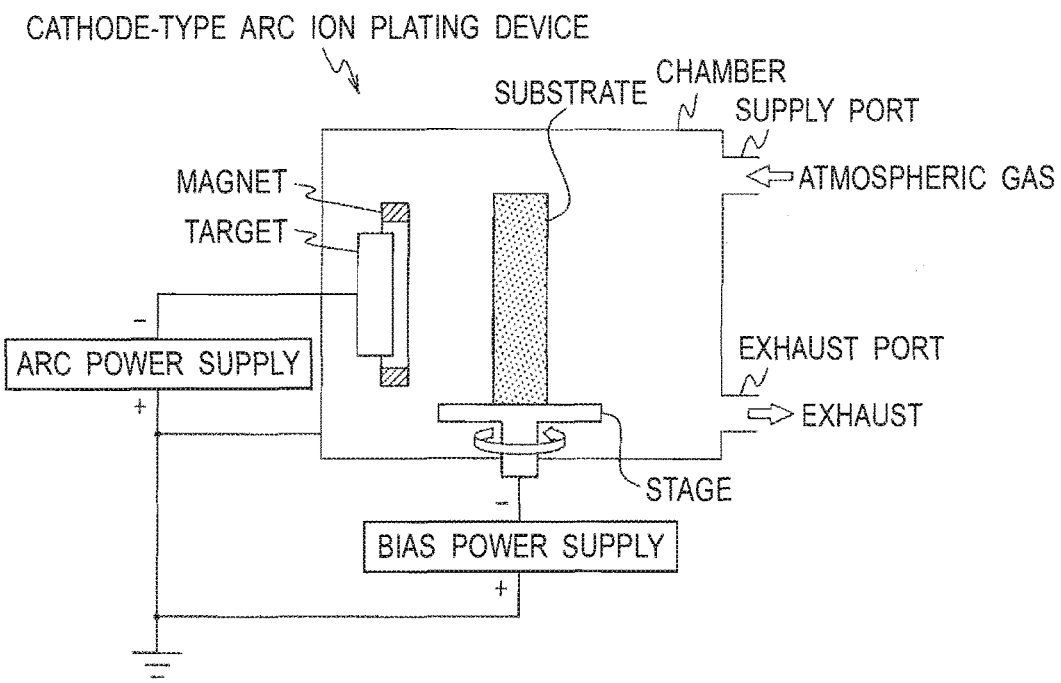
FIG. 5 is a schematic view of a cathode-type arc ion plating device.

Formation of a hard film by such a method can be performed, for example, by a cathode-type arc ion plating device shown in FIG. 5 (see JP 4950499 B2) or a film formation device shown in FIG. 1 of Patent Document 1. As shown in FIG. 5, the cathode-type arc ion plating device includes a chamber, a stage (table) capable of rotating in a state where a substrate is placed thereon, a bias power supply connected to the stage, an arc power supply connected to a target, a magnet for applying a magnetic field in a state of surrounding a plate-shaped target, and a heater (not shown). The chamber includes an exhaust port for evacuation, and a supply port for supplying an atmosphere gas (carrier gas, or carrier gas+film forming gas), and is connected to an earth potential. In FIG. 5, the cathode-type arc ion plating device is mounted with one target for simplification, but is preferably mounted with a plurality of targets in a height direction, and it is easy to uniformly form a hard film on the entire surface of the substrate formed into a complicated shape, along with the rotating stage.

As mentioned above, it is preferable to form an intermediate layer or an adhesion layer such as a metal layer as a ground before the formation of a hard film, depending on the material of the substrate. It is possible to form the intermediate layer, the metal layer and the multilayered film (WC-based film, metal carbide film) by a sputtering method, or an AIP method which is the same as in the hard film. At this time, when using a switchable film formation device mounted with a plurality of targets, an adhesion layer (intermediate layer, metal layer, multilayered film) and a hard film can be continuously formed.

To form each film of the adhesion layer, a target made of the material that forms the film may be used. For example, a CrN film can be formed as the intermediate layer in a nitrogen ($N_2$) atmosphere, an $Ar+N_2$ atmosphere or the like, using a target made of Cr. For example, a TiC film may be formed in an $Ar+CH_4$ atmosphere, using a target made of Ti. Meanwhile, a metal layer may be formed by supplying only a carrier gas, using a metal target made of a material of the metal layer. Therefore, when the intermediate layer and the metal layer are laminated to form an adhesion layer (see FIG. 3), for example, a target can be used in common by using a TiC film in combination with a Ti film, or using a CrN film in combination with a Cr film. Further, when a multilayered film is formed (see FIG. 4), for example, a CrN film or a Cr film can be used in combination with a CrC film so as to use a target in common with the metal layer and the like and the metal carbide film under the multilayered film. A WC-based film of a multilayered film can be formed in either an Ar atmosphere or an $Ar+CH_4$ atmosphere, in the same manner as in the formation of the hard film. To form a multilayered film by repeating the film formation alternately with the metal carbide film, it is preferable to alternately discharge a WC-based alloy target and a metal target for a metal carbide film in an $Ar+CH_4$ atmosphere. It is also possible to use this WC-based alloy target for formation of a hard film.

While a description has been made of embodiments of the present invention regarding a hard film according to the present invention and a method for forming the same, and a die for use in hot forming of a steel sheet, a description will be made of Examples in which the effect of the present invention has been confirmed, while comparing with Comparative Examples which do not meet the requirements of the present invention. It should be noted that the present invention is not limited to these Examples and the above embodiments, and various changes and modifications made based on these descriptions are also included in the scope of the present invention.

EXAMPLE 1

[Production of Test Materials]
(Formation of Film)

Using a ball made of SK61 (diameter 10 mm, mirror finish) as a substrate, a film with the composition shown in Table 1 was formed on a surface of the substrate by an AIP method. The temperature of the substrate was raised to 400° C. by a heater in a chamber and the pressure in the chamber was adjusted to 0.6 Pa in an Ar atmosphere, and then a voltage of 500 V was applied to thereby perform cleaning of a surface of the substrate by Ar ions for 5 minutes. Next, $N_2$ was introduced to thereby adjust the pressure to 1.33 Pa, and a bias potential of 50 V was applied to the substrate so that the substrate exhibits a negative potential relative to an earth potential. Using a Cr target, Arc discharge was initiated to form a CrN film having a thickness of about 3 μm on the surface of the substrate. Next, $N_2$ was evacuated and Ar or $Ar+CH_4$ was introduced to thereby adjust the pressure to 2.7 Pa, and a bias potential of 50 V was applied to the substrate so that the substrate exhibits a negative potential relative to an earth potential. After switching the target, arc discharge was initiated to form a film having a thickness of 7 μm on the surface of the substrate with the CrN film formed thereon, thus obtaining test materials (test materials Nos. 4 to 25). In the film formation mentioned above, Ar and $CH_4$ were introduced while changing a mixing ratio, and various targets made of cemented carbides of a WC—Co alloy, a WC—Ni alloy, a WC—Fe alloy and a WC—Cu alloy, each having different content rate of Co were used. As Comparative Examples, using metal targets corresponding to the compositions of test materials Nos. 1 to 3 in Table 1, $N_2$ was introduced after cleaning to form a film having a thickness 7 μm on the surface of the substrate (test materials Nos. 1 to 3).

(Measurement of Composition of Film)

Regarding the thus obtained test materials, each composition of the thus formed film was measured by Auger electron spectroscopy (AES). The results are shown in Table 1.

[Evaluation]
(Wear Resistance)

Figure 6:
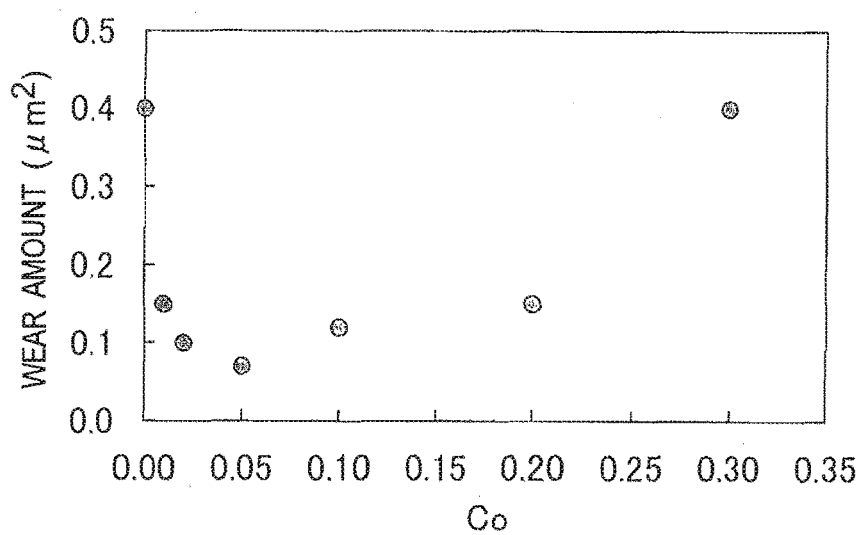
FIG. 6 is a graph showing dependency of a wear amount of a hard film according to Examples on a Co atomic ratio.
Figure 7:
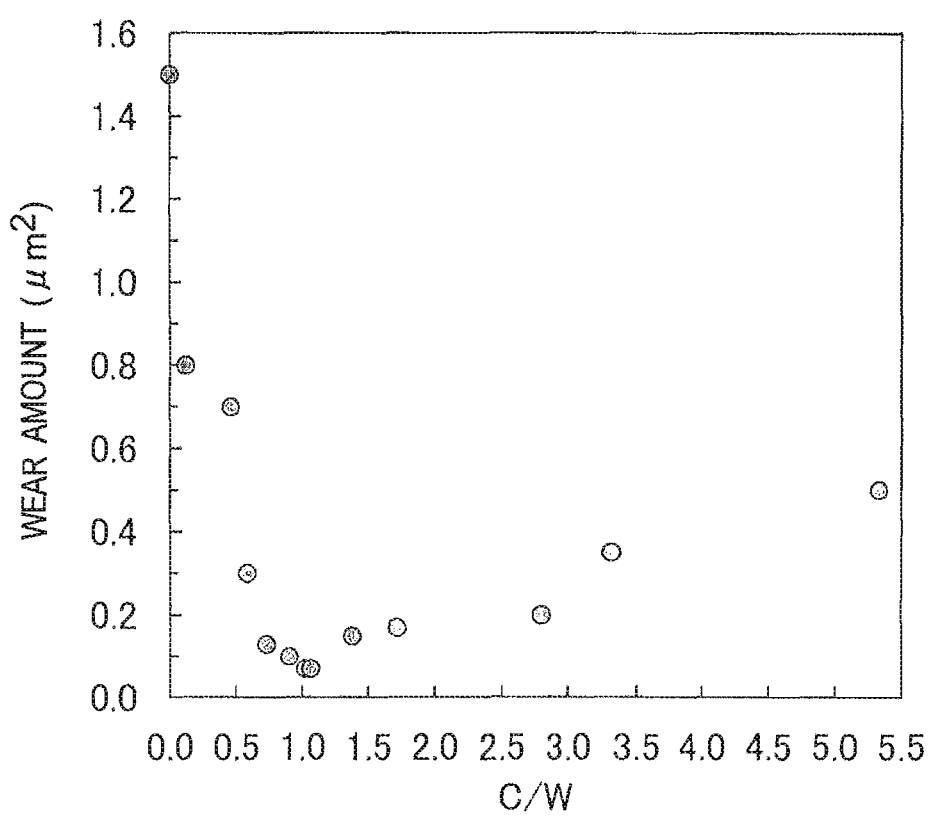
FIG. 7 is a graph showing dependency of a wear amount of a hard film according to Examples on a C/W atomic weight ratio.

Each test material was subjected to a ball-on-plate type reciprocating sliding test, and a wear amount of the film was observed. The plate used was a steel sheet (0.25C-1.4Mn-0.35Si, with the balance being Fe) with an oxidation scale (with composition mainly of $Fe_2O_3$ and $Fe_3O_4$) formed on a surface of the sheet by subjecting to an oxidation treatment. The test material was allowed to reciprocatively slide on the surface of the steel sheet at room temperature under a vertical load of 5 N under the conditions of a sliding rate of 0.1 m/s, a slide width of 30 mm, and a sliding distance of 72 m. After the test, the sliding surface of the test material was observed and an area was measured from a diameter of a region where a film was worn, and regarded as a wear amount. The results are shown in Table 1. Pass criteria of wear resistance is as follows: wear amount is less than 0.40 $\mu m^2$. In the test materials Nos. 4 to 10 in which a C/W ratio of a film is about 1, a graph showing dependency of a wear amount on the content rate (atomic ratio) of Co is shown in FIG. 6. In the test materials Nos. 7, and 11 to 22 in which a Co atomic ratio of a film is 0.05, a graph showing dependency of a wear amount on a C/W ratio is shown in FIG. 7.

TABLE 1

| Type | No. | M Element | M Atomic ratio | W Atomic ratio | C Atomic ratio | C/W | Wear amount ($\mu m^2$) |
|---|---|---|---|---|---|---|---|
| Comparative Examples | 1 | $(Ti_{0.5}Al_{0.5})N*$ | 0 | 0 | — | 0.90 | |
| | 2 | TiN* | 0 | 0 | — | 1.10 | |
| | 3 | $(Al_{0.5}Cr_{0.5})N*$ | 0 | 0 | — | 0.40 | |
| | 4 | — | 0* | 0.50 | 0.50 | 1.0 | 0.40 |
| Examples | 5 | Co | 0.01 | 0.49 | 0.50 | 1.0 | 0.15 |
| | 6 | Co | 0.02 | 0.49 | 0.49 | 1.0 | 0.10 |
| | 7 | Co | 0.05 | 0.47 | 0.48 | 1.0 | 0.07 |
| | 8 | Co | 0.10 | 0.45 | 0.45 | 1.0 | 0.12 |
| | 9 | Co | 0.20 | 0.40 | 0.40 | 1.0 | 0.15 |
| Comparative Examples | 10 | Co | 0.30* | 0.35 | 0.35 | 1.0 | 0.40 |
| | 11 | Co | 0.05 | 0.95 | 0 | 0* | 1.50 |
| | 12 | Co | 0.05 | 0.85 | 0.10 | 0.12* | 0.80 |
| | 13 | Co | 0.05 | 0.65 | 0.30 | 0.46* | 0.70 |
| Examples | 14 | Co | 0.05 | 0.60 | 0.35 | 0.58 | 0.30 |
| | 15 | Co | 0.05 | 0.55 | 0.40 | 0.73 | 0.13 |
| | 16 | Co | 0.05 | 0.50 | 0.45 | 0.90 | 0.10 |
| | 17 | Co | 0.05 | 0.46 | 0.49 | 1.1 | 0.07 |
| | 18 | Co | 0.05 | 0.40 | 0.55 | 1.4 | 0.15 |
| | 19 | Co | 0.05 | 0.35 | 0.60 | 1.7 | 0.17 |
| | 20 | Co | 0.05 | 0.25 | 0.70 | 2.8 | 0.20 |
| | 21 | Co | 0.05 | 0.22 | 0.73 | 3.3 | 0.35 |
| Comparative Examples | 22 | Co | 0.05 | 0.15 | 0.80 | 5.3* | 0.50 |
| Examples | 23 | Ni | 0.05 | 0.35 | 0.60 | 1.7 | 0.15 |
| | 24 | Fe | 0.05 | 0.35 | 0.60 | 1.7 | 0.20 |
| | 25 | Cu | 0.05 | 0.35 | 0.60 | 1.7 | 0.25 |

*departing from the scope of the present invention

As shown in Table 1 and FIG. 6, the test material No. 4 in which a film made of WC is formed exhibited wear resistance equivalent to that of the test material No. 3 disclosed in Patent Document 1. However, excellent wear resistance was exhibited in the test materials Nos. 5 to 9, and 14 to 21 which are Examples in which a film containing Co added therein according to the present invention is formed. If an atomic ratio of Co exceeds 0.05, degradation of wear resistance is initiated. In the test material No. 10 containing excess Co, wear resistance was degraded to the same degree as in the test material No. 4 in which no Co is added.

As shown in Table 1 and FIG. 7, when a comparison is made between films in which the amount of Co is constant (atomic ratio of 0.05), wear resistance was drastically inferior in the test material No. 11 in which a film made of a C-free W—Co alloy is formed. In the test materials Nos. 12 and 13 in which the content rate of C is low against that of W, leading to lack of a C/W ratio, wear resistance was insufficient. Whereas, in the test materials Nos. 14 to 21 which are Examples in which the hard film containing C in a predetermined range according to the present invention is formed, excellent wear resistance was exhibited, and a C/W ratio being in a range of 0.8 to 1.2 was particularly excellent (the test materials Nos. 7, 16, and 17). However, when the C/W ratio further increases, degradation of wear resistance is initiated. In the test material No. 22 in which a C/W ratio is excessive, insufficient wear resistance was exhibited.

As shown in Table 1, in the test materials Nos. 23 to 25 which are Examples in which the hard film containing Ni, Fe and Cu added therein according to the present invention is formed, excellent wear resistance was exhibited, like Example in which Co is added. When a comparison was made among the test materials Nos. 19 and 23 to 25 in which content rate of metal element (Co, Ni, Fe, or Cu) and that of C are same, wear resistance was particularly excellent in the test materials in which Co or Ni is selected.

EXAMPLE 2

A comparison was made of productivity and the like between the hard films according to the present invention formed by two kinds of film formation methods of an AIP method and a sputtering method. After cleaning a surface of the same substrate as in Example 1, Ar+CH$_4$ were introduced and a film having a thickness 3 μm was formed on the surface of the substrate by the target and the film formation method shown in Table 2. The conditions of the test materials Nos. 26 to 29 (AIP method) are the same as in Example 1. Regarding the test materials Nos. 30 to 32 (sputtering method), film formation was performed after adjusting the pressure in the chamber to 0.6 Pa. Each time required for film formation was measured and the film formation rate was calculated and the results are shown in Table 2. In the same manner as in Example 1, the composition of the thus formed film was measured by AES, and the results are shown in Table 2.

TABLE 2

| Test material No. | Composition of target | Film formation method | Film formation rate (μm/hour) | Composition of hard film | Remarks |
|---|---|---|---|---|---|
| 26 | W | AIP | — | $W_{0.50}C_{0.50}$ | Unstable discharge |
| 27 | $W_{0.5}C_{0.5}$ | AIP | 7 | $W_{0.50}C_{0.50}$ | Unstable discharge |
| 28 | $W_{0.47}C_{0.48}Co_{0.05}$ | AIP | 12 | $W_{0.47}C_{0.48}Co_{0.05}$ | |
| 29 | $W_{0.45}C_{0.45}Co_{0.10}$ | AIP | 15 | $W_{0.45}C_{0.45}Co_{0.10}$ | |
| 30 | W | Sputtering | 2 | $W_{0.50}C_{0.50}$ | |
| 31 | $W_{0.5}C_{0.5}$ | Sputtering | 3 | $W_{0.50}C_{0.50}$ | |
| 32 | $W_{0.47}C_{0.48}Co_{0.05}$ | Sputtering | 5 | $W_{0.47}C_{0.48}Co_{0.05}$ | |

As shown in Table 2, in the test materials Nos. 28 and 29 in which a target made of a WC—Co alloy was used by an AIP method which is a formation method according to the present invention, it was possible to form a hard film according to the present invention at a high film formation rate in a state of stable arc discharge. Whereas, in the test material No. 26 in which a W target having a high melting point was used, film formation could not be performed because of very unstable arc discharge. In the test material No. 27 in which a WC target having a melting point, which is lower than that of W but is high, a film formation rate significantly decreased as compared with the test materials Nos. 28 and 29 because of unstable arc discharge.

Meanwhile, in the test materials Nos. 30 to 32 to which a sputtering method was applied, it was possible to satisfactorily form a film even when using a W target and a WC target, each having a high melting point, but the film formation rate was less than or equal to half that of the test materials Nos. 28 and 29 to which an AIP method was applied.

EXAMPLE 3

[Production of Test Materials]

A comparison was made of adhesion between the hard films according to the present invention by the presence or absence of an adhesion layer and material. An adhesion layer shown in Table 3 and a hard film according to the present invention made of WC—Co having a thickness of 7 μm were continuously formed on a surface (upper surface) of a thick plate made of SKD11 (HRC60) (40 mm×40 mm×10 mm), as a substrate, by an AIP method. Regarding a thickness of the adhesion layer, a thickness of an intermediate layer is 10 μm, a thickness of a metal layer is 0.5 μm, and a thickness of a multilayered film is 1 μm. Regarding the multilayered film, a thickness of a single layer of each of a WC-based film (WC—Co film) and a metal carbide film (CrC film, TiC film) was set at about 30 nm. In the test material No. 33, no adhesion layer was formed and, after cleaning a surface of the substrate, a hard film was directly formed. The conditions of cleaning of the surface of the substrate, and formation of the hard film are the same as in Example 1. In the formation of the intermediate layer, in the same manner as in the CrN film in Example 1, $N_2$ or Ar+$CH_4$ were supplied to an atmosphere gas using a target of metal such as Cr or an alloy. In the formation of the metal layer, Ar was supplied to an atmosphere gas using a metal target. In the formation of the multilayered film, the same Ar+$CH_4$ as in the formation of the hard film were supplied, and a target of Cr or Ti and the same WC—Co target as in the hard film were alternately discharged. Regarding the obtained test materials, the composition of the thus formed hard film was measured by AES in the same manner as in Example 1. As a result, it was $W_{0.475}C_{0.475}Co_{0.05}$. It is estimated that the composition of the hard film is identical to that of the WC—Co film of the multilayered film in which the film formation conditions such as a target and an atmosphere are common with the case of the hard film.

[Evaluation]
(Adhesion)

Test materials were subjected to a scratch test, and adhesion of the hard film was evaluated by the load under which peeling occurred in the hard film. In the scratch test, a diamond indenter having a tip radius of 200 μm was allowed to slide on a surface of the hard film of the test material under the conditions of a load range of 0 to 80 N, a load increase rate of 100 N/minute, and a movement speed of 10 mm/minute. The load under which peeling occurred in the hard film is shown as an adhesion force in Table 3.

TABLE 3

| Test material No. | Adhesion layer | | | Adhesion force (N) |
|---|---|---|---|---|
| | Intermediate layer | Metal layer | Multilayered film | |
| 33 | — | — | — | 25 |
| 34 | — | Cr | — | 75 |
| 35 | CrN | — | — | 55 |
| 36 | TiN | — | — | 50 |
| 37 | $(Ti_{0.5}Al_{0.5})N$ | — | — | 50 |
| 38 | $(Al_{0.6}Ti_{0.2}Cr_{0.2})N$ | — | — | 45 |
| 39 | $(Al_{0.65}Cr_{0.35})N$ | — | — | 53 |
| 40 | CrN | Cr | — | 90 |
| 41 | CrN | Ti | — | 70 |
| 42 | CrN | V | — | 65 |
| 43 | CrN | Mo | — | 65 |
| 44 | CrN | Al | — | 70 |
| 45 | CrN | Si | — | 60 |
| 46 | TiN | Ti | — | 70 |
| 47 | $(Ti_{0.5}Al_{0.5})N$ | TiAl | — | 75 |
| 48 | — | Cr | [$W_{0.475}C_{0.475}Co_{0.05}$/CrC] | 80 |
| 49 | CrN | — | [$W_{0.475}C_{0.475}Co_{0.05}$/CrC] | 70 |
| 50 | CrN | Cr | [$W_{0.475}C_{0.475}Co_{0.05}$/CrC] | 100 |
| 51 | TiC | Cr | [$W_{0.475}C_{0.475}Co_{0.05}$/CrC] | 85 |
| 52 | TiCN | Cr | [$W_{0.475}C_{0.475}Co_{0.05}$/CrC] | 90 |
| 53 | TiN | Ti | [$W_{0.475}C_{0.475}Co_{0.05}$/CrC] | 75 |

As shown in Table 3, as compared with the test material No. 33 in which no adhesion layer is formed, high adhesion was exhibited in the test materials Nos. 34 to 53 in which at least one of an intermediate layer and a metal layer is formed as an adhesion layer. Particularly, as compared with a single layer structure composed only of an intermediate layer or a metal layer, high adhesion was exhibited in the test materials Nos. 40 to 49 in which an adhesion layer composed of two layers of an intermediate layer and a metal layer, or an intermediate layer or a metal layer and a multilayered film is formed. Further, high adhesion was exhibited in the test materials Nos. 50 to 53 in which an adhesion layer composed of three layers of an intermediate layer, a metal layer and a multilayered film is formed. Of these test materials, comparatively high adhesion was exhibited in the test materials Nos. 40, 46, 47, 50, and 53 in which a metal layer is combined with an intermediate layer made of a nitride of metal that forms the metal layer. In the test materials Nos. 34 and 48 in which a Cr film is formed on a surface of a substrate, and the test materials Nos. 35, 40 to 45, 49, and 50 in which a CrN film is formed on a surface of a substrate, satisfactory affinity with an iron-base substrate (SKD11) was exhibited. Of these test materials, excellent adhesion was exhibited in the test material No. 40 in which a CrN film and a Cr film are formed in a state of being laminated, and most excellent adhesion was exhibited in the test material No. 50 in which a multilayered film is formed.

The present invention include the following aspects.

Aspect 1:

A hard film based on tungsten carbide excellent in wear resistance, wherein the composition of the film is defined by $W_{1-x-y}C_xM_y$, where $0.01 \leq y \leq 0.2$, $0.50 \leq x/(1-x-y) \leq 4.0$, and M is one or more selected from Co, Ni, Fe and Cu.

Aspect 2:

The hard film according to the aspect 1, wherein the film is formed on an intermediate layer having a thickness of 1 μm or more consisting of a nitride, a carbonitride or a carbide of one or more elements selected from the group consisting of Group 4, Group 5, Group 6, Al, and Si formed on a surface of a substrate.

Aspect 3:

The hard film according to the aspect 1 or 2, wherein a metal layer is formed as a ground, and the metal layer has a thickness of 50 nm or more consisting of one or more elements selected from the group consisting of Group 4, Group 5, Group 6, Al and Si.

Aspect 4:

The hard film according to the aspect 2 or 3, wherein the film is formed on a multilayered film laminated on the intermediate layer or the metal layer, and the multilayered film is formed by alternately laminating a film consisting of one or more selected from the group consisting of W, C, Co, Ni, Fe and Cu, and a film consisting of one or more elements selected from the group consisting of Group 4, Group 5, Group 6, Al and Si.

Aspect 5:

The hard film according to the aspect 3 or 4, wherein the intermediate layer consists of CrN, and the metal layer formed on the intermediate layer consists of Cr.

Aspect 6:

A die for use in hot forming of a steel sheet, wherein the hard film according to any one of the aspects 1 to 5 is formed on a surface of the die.

Aspect 7:

A method for forming the hard film according to the aspect 1, wherein the method includes forming the hard film by a cathode-type arc ion plating method using a target consisting of W, C and the metal element M in the composition.

DESCRIPTION OF REFERENCE NUMERALS

10 Die for use in hot forming of steel sheet
1 Substrate
2 Hard film
3, 3A, 3B, 3C Adhesion layer
31 Intermediate layer
32 Metal layer
33 Multilayered film

The invention claimed is:

1. A hard film based on tungsten carbide having a composition defined by $W_{1-x-y}C_xM_y$, where $0.01 \leq y \leq 0.05$, $0.50 \leq x/(1-x-y) \leq 4.0$, and M is one or more metal elements selected from the group consisting of Co, Fe and Cu.

2. The hard film according to claim 1, wherein the film is formed on an adhesion layer formed on a surface of a substrate and comprising an intermediate layer, which has a thickness of 1 μm or more and consists of a nitride, a carbonitride or a carbide of one or more elements selected from the group consisting of a Group 4 element, a Group 5 element, a Group 6 element, Al and Si.

3. The hard film according to claim 2, wherein
the adhesion layer further comprises a multilayered film laminated on the intermediate layer, and
the multilayered film is formed by alternately laminating a film consisting of one or more elements selected from the group consisting of W, C, Co, Ni, Fe and Cu, and a film consisting of one or more elements selected from the group consisting of a Group 4 element, a Group 5 element, a Group 6 element, Al and Si.

4. The hard film according to claim 2, wherein
the adhesion layer further comprises a metal layer formed on the intermediate layer,
the intermediate layer consists of CrN, and
the metal layer consists of Cr.

5. The hard film according to claim 2, wherein
the adhesion layer further comprises a metal layer formed on the intermediate layer, and
the metal layer has a thickness of 50 nm or more and consists of one or more elements selected from the group consisting of a Group 4 element, a Group 5 element, a Group 6 element, Al and Si.

6. The hard film according to claim 1, wherein
the film is formed on an adhesion layer comprising a metal layer, which has a thickness of 50 nm or more and consists of one or more elements selected from the group consisting of a Group 4 element, a Group 5 element, a Group 6 element, Al and Si.

7. The hard film according to claim 6, wherein the adhesion layer further comprises a multilayered film laminated on the metal layer, and
the multilayered film is formed by alternately laminating a film consisting of one or more elements selected from the group consisting of W, C, Co, Ni, Fe and Cu, and a film consisting of one or more elements selected from the group consisting of a Group 4 element, a Group 5 element, a Group 6 element, Al and Si.

8. The hard film according to claim 7, wherein
the adhesion layer further comprises an intermediate layer having a thickness of 1 μm or more and consisting of a nitride, a carbonitride or a carbide of one or more elements selected from the group consisting of a Group 4 element, a Group 5 element, a Group 6 element, Al and Si; and
the metal layer is formed on the intermediate layer.

9. A die for hot forming a steel sheet, wherein the hard film according to claim 1 is formed on a surface of the die.

10. A method for forming the hard film according to claim 1, the method comprising:
forming the hard film by a cathode-type arc ion plating method using a target consisting of W, C and the one or more metal elements M.

* * * * *